(12) United States Patent
Schmidt

(10) Patent No.: US 9,419,199 B2
(45) Date of Patent: Aug. 16, 2016

(54) ACTUATOR, ACTUATOR SYSTEM, AND CONTROL OF AN ACTUATOR

(75) Inventor: Johann Schmidt, Graz (AT)

(73) Assignee: EPCOS AG, Munich (DE)

(*) Notice: Subject to any disclaimer, the term of this patent is extended or adjusted under 35 U.S.C. 154(b) by 427 days.

(21) Appl. No.: 13/995,940

(22) PCT Filed: Dec. 20, 2011

(86) PCT No.: PCT/EP2011/073421
§ 371 (c)(1),
(2), (4) Date: Sep. 10, 2013

(87) PCT Pub. No.: WO2012/084957
PCT Pub. Date: Jun. 28, 2012

(65) Prior Publication Data
US 2013/0342083 A1    Dec. 26, 2013

(30) Foreign Application Priority Data

Dec. 22, 2010  (DE) .................. 10 2010 055 621

(51) Int. Cl.
*H01L 41/047* (2006.01)
*H02N 2/06* (2006.01)

(52) U.S. Cl.
CPC ............ *H01L 41/0472* (2013.01); *H02N 2/067* (2013.01)

(58) Field of Classification Search
CPC ..... H01L 41/083; H01L 41/047; H01L 41/39; H01L 41/107; H01L 41/0472
USPC .................................................. 310/311–371
See application file for complete search history.

(56) References Cited

U.S. PATENT DOCUMENTS

| 3,489,931 | A | * | 1/1970 | Teaford ..................... 310/331 |
| 3,531,742 | A | * | 9/1970 | Futami et al. .............. 333/187 |
| RE27,116 | E | * | 4/1971 | Miller et al. ................ 310/359 |
| 3,590,287 | A | * | 6/1971 | Berlincourt et al. ........ 310/321 |
| 4,454,441 | A | * | 6/1984 | Taniguchi ................... 310/328 |
| 4,564,782 | A | * | 1/1986 | Ogawa ........................ 310/359 |
| 4,649,313 | A | * | 3/1987 | Ogawa et al. ............... 310/358 |
| 4,932,119 | A |   | 6/1990 | Ealey et al. |
| 4,997,177 | A |   | 3/1991 | Mori et al. |
| 5,686,777 | A |   | 11/1997 | Chang |

(Continued)

FOREIGN PATENT DOCUMENTS

| CN | 1396668 A | 2/2003 |
| DE | 4140676 A1 | 6/1993 |

(Continued)

*Primary Examiner* — Thomas Dougherty
(74) *Attorney, Agent, or Firm* — McDermott Will & Emery LLP

(57) ABSTRACT

The invention relates to an actuator (1), comprising: piezoelectric elements (16) arranged in a stack; first and second inner electrodes (5, 3), which are alternately arranged between the piezoelectric elements (16); a first outer electrode (4), which is connected to the first inner electrodes (5) in an electrically conductive manner; a second outer electrode (2), which is connected to the second inner electrodes (3) in an electrically conductive manner, characterized in that the actuator (1) comprises a plurality of actuator sections (81, 82, 83, 84, 85) and in that the second outer electrode (2) comprises separate electrode segments (21, 22, 23), which are each connected in an electrically conductive manner to the second inner electrodes (3) in one of the actuator sections (81, 82, 83, 84, 85) or in a group of the actuator sections (81, 82, 83, 84, 85).

7 Claims, 3 Drawing Sheets

(56) References Cited

U.S. PATENT DOCUMENTS

Figure 1:
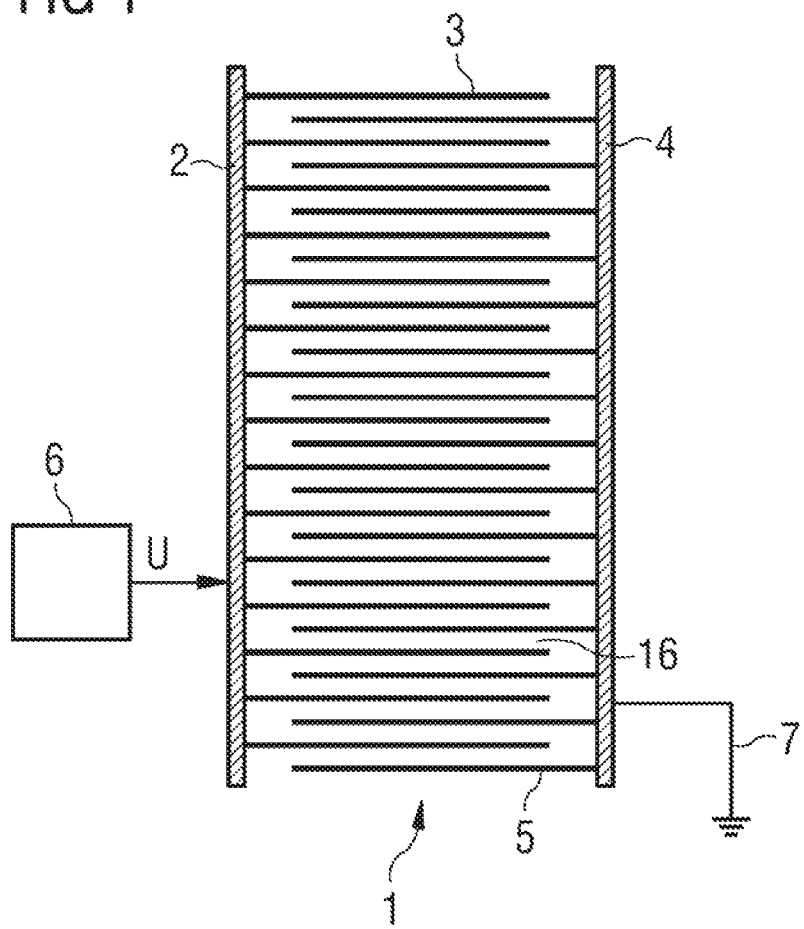

| | | | |
|---|---|---|---|
| 6,577,044 B1 * | 6/2003 | Li | 310/366 |
| 6,765,337 B1 | 7/2004 | Heinz et al. | |
| 2003/0098633 A1 * | 5/2003 | Nishimura et al. | 310/366 |
| 2004/0145632 A1 | 7/2004 | Lee et al. | |
| 2007/0200109 A1 | 8/2007 | Sciortino et al. | |
| 2013/0270968 A1 * | 10/2013 | Gabl | 310/366 |
| 2014/0001920 A1 * | 1/2014 | Auer et al. | 310/317 |

FOREIGN PATENT DOCUMENTS

| | | | | |
|---|---|---|---|---|
| DE | 19802302 A1 | 7/1999 | | |
| DE | 10321705 A1 | 12/2004 | | |
| DE | 102004025073 A1 | 1/2005 | | |
| DE | 102007046315 A1 | 4/2009 | | |
| EP | 1821351 A1 | 8/2007 | | |
| JP | 62073787 | 4/1987 | | |
| JP | 63-078582 | 4/1988 | | |
| JP | 63120480 A | 5/1988 | | |
| JP | S63194377 A | 8/1988 | | |
| JP | 01093184 A | 4/1989 | | |
| JP | 05-160459 A * | 12/1991 | | 310/366 |
| JP | H05327054 A | 12/1993 | | |
| JP | 07-223315 A * | 8/1995 | | B41J 2/045 |
| JP | 07223315 A | 8/1995 | | |
| JP | 2004216899 A | 8/2004 | | |
| JP | 2005-347484 A | 12/2005 | | |
| JP | 2009266921 A | 11/2009 | | |
| JP | 2010245187 A | 10/2010 | | |

\* cited by examiner

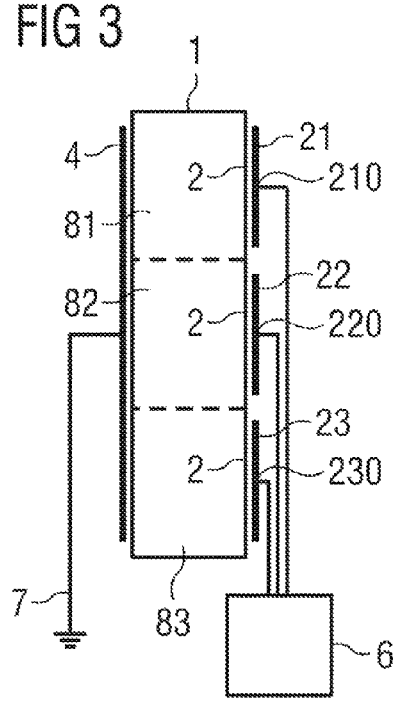
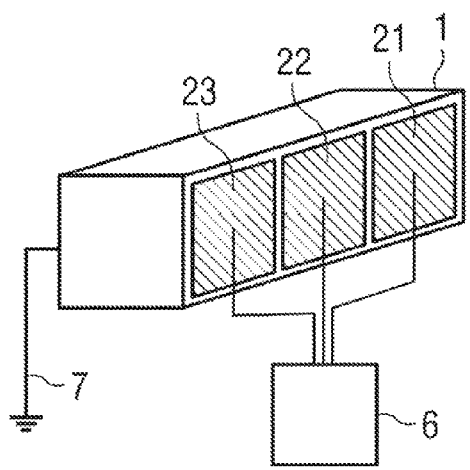
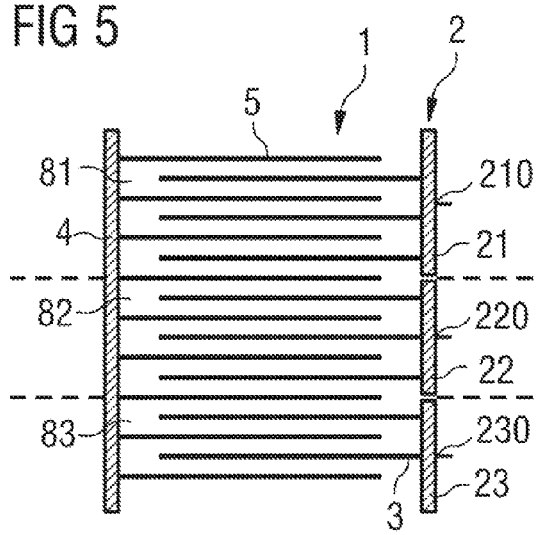
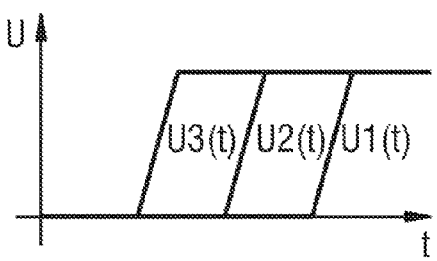

ACTUATOR, ACTUATOR SYSTEM, AND CONTROL OF AN ACTUATOR

Actuators, for example multilayer actuators, are used in a variety of fields; one example is injection systems for engines. Actuators comprise piezoelements, which expand when a voltage is applied. Actuators having ever faster switching times in conjunction with ever higher strokes are desired for injection systems. The two requirements are mutually contradictory: for higher strokes, longer actuators are also required owing to the maximum expandability of the ceramic in the actuators. The speed at which the actuator expands is dependent on the velocity of sound in the actuator. Owing to the limited velocity of sound in the actuator, as the length of the actuator increases, the switching times thereof also become longer. The expansion propagates within the actuator in the form of an elastic wave. In this case, each individual domain, that is to say each expanding piezoelement, is a source of a partial wave. These are ultimately superimposed to form an overall deformation. Owing to the different propagation times of the partial waves from their originating location as far as the actuator head, even with an ideally steep control voltage of the actuator, this results in a minimum slope time of the actuator expansion, that is to say the time until the actuator has expanded, which cannot be undershot for physical reasons.

Two methods for achieving higher strokes despite restrictions mentioned above use relatively short actuators and thus have in association short switching times. The strokes or required actuating travels can be achieved by mechanical boosting by means of a rocker arm or by mechanical boosting by means of a hydraulic booster.

The problem addressed is that of providing an actuator which is improved with regard to the aspects mentioned above.

The problem is solved by means of an actuator comprising the features of patent claim 1. Provision is made of an actuator comprising piezoelements arranged in a stacked fashion, first and second internal electrodes arranged alternately between the piezoelements, a first external electrode, which is electrically conductively connected to the first internal electrodes, and a second external electrode, which is electrically conductively connected to the second internal electrodes. The actuator comprises a plurality of actuator sections, and the second external electrode comprises separate electrode segments, which are electrically conductively connected in each case to the second internal electrodes in one of the actuator sections or in a group of the actuator sections. Each actuator section is electrically conductively connected only to one portion of the second internal electrodes. The separate electrode segments which do not touch one another or are not directly electrically conductively connected to one another allow the actuator sections to be controlled in a temporally shifted manner, such that the expansion process is not activated simultaneously for all the piezoelements, but rather in a temporally shifted manner.

The actuator comprises a plurality of sections, each having piezoelements and internal electrodes, which are controlled in a time-shifted manner. The control is not effected simultaneously for all regions of the entire actuator, but rather is effected in a time-shifted manner for the individual sections thereof. The time shift is advantageously chosen such that it corresponds exactly to the velocity of sound in the actuator. As a result, during the expansion of the actuator, the elastic partial waves are superimposed in such a way as to result in a significantly shorter slope time for the expansion of the actuator than would be the case with simultaneous control of the external electrode. The lower limit of the slope time is no longer limited by the length of the entire actuator, but rather by the length of the individual regions.

Further advantageous configurations of the invention are specified in the dependent patent claims.

In one embodiment, the first external electrode, too, comprises separate electrode segments, which are electrically conductively connected in each case only to a portion of the first internal electrodes, namely to the first internal electrodes in one of the actuator sections or in a group of the actuator sections. The provision of two segmented external electrodes allows greater degrees of freedom in the design of the actuator. The division of the segments in the case of the first and second external electrodes can correspond. Alternatively, the segmentation is asymmetrical.

In one embodiment, the electrode segments are electrically conductively connected in each case to either the first or the second internal electrodes in adjacent actuator sections. In the case of a segmented first and a segmented second external electrode, this makes it possible that a first electrode segment of the first external electrode is electrically conductively connected to the first internal electrodes in a first actuator section and a second actuator section, adjacent to the first, and that a second electrode segment of the second external electrode is electrically conductively connected to the second internal electrodes in the second actuator section and in a third actuator section, adjacent to the second. In other words: the first and second external electrodes are arranged in a manner offset with respect to one another in such a way that they make electrically conductive contact with internal electrodes in the same and also in different actuator sections.

In one embodiment, at least the electrode segments of the second external electrode in each case comprise a terminal, to which a control signal can be applied. The temporally shifted control signals enable the time-shifted control of the actuator sections. In the case of a segmented first external electrode, the segments thereof also have terminals.

An actuator system comprises an actuator and a control arrangement, by means of which a first control signal can be applied to one of the actuator sections and a second control signal can be applied in a time-shifted manner to a further actuator section.

The actuator can expand in one direction, for example on account of its fixing at the actuator base. A first actuator section is arranged in this direction relative to a second actuator section, wherein the control arrangement is suitable for applying the first control signal to the first actuator section in a time-delayed manner with respect to the second control signal applied to the second actuator section.

If only one segmented external electrode is provided, the control arrangement applies the control signals to the electrode segments thereof and the other external electrode can be connected to a reference-ground potential. In the case of two segmented external electrodes, the control arrangement is suitable for applying voltages having different signs relative to a reference-ground potential to the electrode segments connected to the first internal electrodes and the electrode segments connected to second internal electrodes. Applying different control signals to the two external electrodes enables better, more flexible control of the actuator.

The time shift is chosen in a manner dependent on the velocity of sound in the actuator, in order to compensate for propagation time differences of the partial waves.

Control of an actuator comprising piezoelements arranged in a stacked fashion, first and second internal electrodes arranged alternately between the piezoelements, wherein the actuator comprises a plurality of actuator sections, provides for applying a control voltage between the first and second internal electrodes in a first actuator section or in a first group of actuator sections in a time-shifted manner with respect to a control voltage applied between the first and second internal electrodes in a second actuator section or in a second group of actuator sections.

The actuator can expand in one direction, wherein the first actuator section is arranged in the direction relative to the second actuator section, and wherein the first control voltage is time-delayed with respect to the second control voltage.

The invention is explained below on the basis of embodiments with reference to the drawing.

Figure 2:
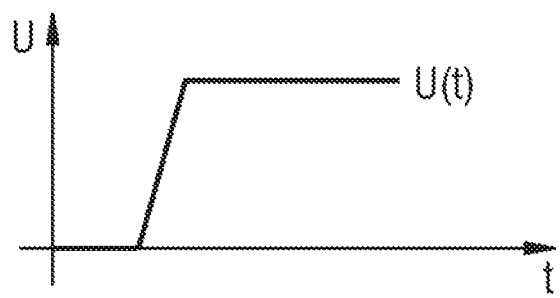
Figure 7:
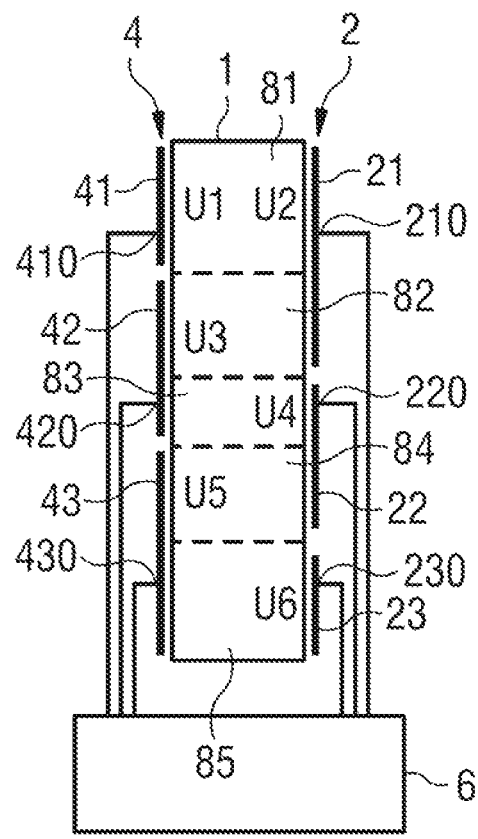
Figure 8:
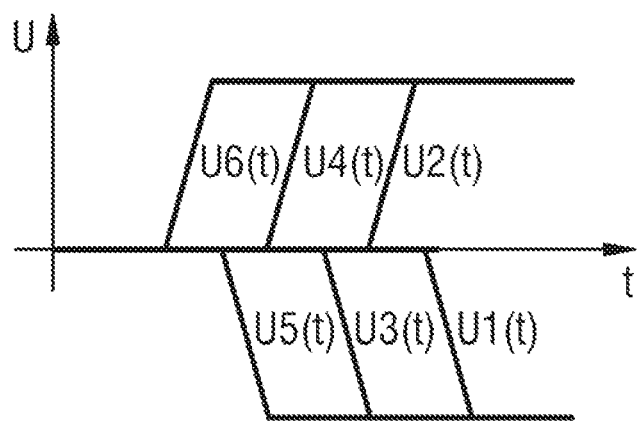

In the figures:

FIG. 1 shows an embodiment of an actuator without segmented external electrodes, FIG. 2 shows the temporal profile of the control voltage for said actuator, FIG. 3 shows an embodiment of an actuator comprising one segmented external electrode, FIG. 4 shows a perspective view thereof, FIG. 5 shows a schematic sectional illustration thereof, FIG. 6 shows the temporal profile of the control voltages present at the electrode segments, FIG. 7 shows a further embodiment of an actuator comprising two segmented external electrodes, FIG. 8 shows the temporal profile of the control voltages present at the electrode segments.

FIG. 1 shows a schematic sectional illustration of a conventional multilayer actuator 1 comprising piezoelements 16 arranged in a stacked fashion. First internal electrodes 5 and second internal electrodes 3 are arranged alternately between the piezoelements 16. The first internal electrodes 5 are electrically conductively connected to a first external electrode 4. The second internal electrodes 3 are electrically conductively connected to a second external electrode 2. The first and second internal electrodes 5 and 3 are in each case led to an outer side of the actuator 1 and are electrically conductively connected there to the first external electrode 4 and second external electrode 2, respectively. This can be effected, for example, by applying a metal paste by printing or by soldering on metallic plates which form the external electrodes 4, 2.

The first external electrode 4 is connected to a reference-ground potential 7. A control arrangement 6 applies a control signal, for example a time-variable control potential, to the second external electrode 2, such that a control voltage U is present between the first and second internal electrodes, the actuator 1 being expanded or compressed depending on said control voltage.

FIG. 2 shows by way of example the profile of a control signal, or voltage, U as a function of time t. The rise in the signal U has a finite gradient.

As a result of the control voltage U being applied, the actuator 1 experiences a stroke. The actuator 1 is expanded in a finite time. The expansion propagates within the actuator 1 in the form of an elastic wave. In this case, each individual domain, or piezoelement 16, is a source of a partial wave. The latter are superimposed, thus resulting in the overall deformation. As a result of the different propagation times of the partial waves from their originating location as far as the actuator head, there arises, even in the case of infinitely steep control, a time required by the expansion process which cannot be undershot for physical reasons. The longer the actuator 1 and the greater the stroke, the greater said time as well.

FIG. 3 shows an embodiment of a multilayer actuator 1 comprising a first external electrode 4 and a segmented second external electrode 2, which has separate electrode segments 21, 22, 23. The separate electrode segments 21, 22, 23 are spatially separated from one another. They are neither directly electrically conductively connected to one another nor do they touch one another. The first external electrode 4 is connected to a reference-ground potential 7. The electrode segments 21, 22, 23 each have a terminal 210, 220, 230, via which they are connected to a control arrangement 6. Control signals can be applied via the terminals 210, 220, 230.

FIG. 4 shows the actuator system comprising the actuator 1 and the control arrangement 6 in a three-dimensional illustration.

FIG. 5 shows a schematic sectional arrangement of the actuator 1. The actuator 1 comprises first and second internal electrodes 5, 3, which are electrically conductively connected to the first external electrodes 4 and the second external electrodes 2, respectively. The actuator 1 comprises a plurality of actuator sections 81, 82, 83. Each axially extended actuator section 81, 82, 83 corresponds to the axial extent of the electrode segments 21, 22, 23. The first electrode segment 21 is electrically conductively connected to the second internal electrodes 3 in the first actuator section 81. The second electrode segment 22 is electrically conductively connected to the second internal electrodes 3 in the second actuator section 82. The third electrode segment 23 is electrically conductively connected to the second internal electrodes 3 in the third actuator section 83. By contrast, the first internal electrodes 5 in the three actuator sections 81, 82, 83 are electrically conductively connected to the same first, continuous external electrode 4.

FIG. 6 schematically shows the temporal profile of the control signals or of the voltages U1, U2, U3 which are present at the electrode segments 21, 22, 23 of the actuator 1. A first control voltage U1 is present at the terminal 210 of the first electrode segment 21. A second control voltage U2 is present at the terminal 220 of the second electrode segment 22. A third control voltage U3 is present at the terminal 230 of the third electrode segment 23. The control voltages U1, U2, U3 are time-delayed, such that the actuator sections 81, 82, 83 are controlled later, the closer they are to the actuator head. The actuator 1 is fixed at the actuator base or third actuator section 83. In other words, one actuator section 81, 82, 83 which is arranged in the direction of the actuator expansion relative to another is controlled in a delayed manner: firstly the third actuator section 83 is controlled, then the second actuator section 82, then the first actuator section 81. In this case, the time shift is chosen such that it corresponds to the velocity of sound in the actuator 1. In this case, the individual partial waves of the actuator sections 81, 82, 83 are superposed in such a way as to result in a significantly shorter expansion time. The lower limit thereof is no longer limited by the actuator length, but rather by the length of the individual actuator sections 81, 82, 83.

FIG. 7 shows a further embodiment of an actuator 1 comprising a segmented first external electrode 4 and a segmented second external electrode 2. The first external electrode 4 has a first, a second and a third electrode segment 41, 42, 43, in this case having different lengths. The second external electrode 2 has a first, a second and a third electrode segment 21, 22, 23, in this case having different lengths. The actuator sections 81, 82, 83, 84, 85 extend axially between incisions between the electrode segments 21, 22, 23, 41, 42, 43. The actuator 1 is fixed at the actuator base or fifth actuator section 85. From among the internal electrodes to which each electrode segment 21, 22, 23, 41, 42, 43 is electrically conductively connected, two are positioned on the edge side, namely the upper and lower internal electrodes which are electrically conductively connected to the electrode segment 21, 22, 23, 41, 42, 43. The actuator sections 81, 82, 83, 84, 85 extend between two adjacent internal electrodes positioned on the edge side, wherein said internal electrodes can be electrically conductively connected to the same or to different electrode segments 21, 22, 23, 41, 42, 43. The first actuator section 81 extends axially along the first electrode segment 41 of the first external electrode 1. The second actuator section 82 extends axially from the marginally positioned internal electrode of the second electrode segment 42 of the first external electrode 1 as far as that of the first electrode segment 21 of the second external electrode 2. Since the segments 41, 42, 43 of the first external electrode are arranged such that they are arranged in an offset manner relative to the electrode segments 21, 22, 23 of the second external electrode 2, the electrode segments 21, 22, 42, 43 are electrically conductively connected to the internal electrodes of adjacent actuator sections 81, 82, 83, 84, 85. Thus, by way of example the first electrode segment 21 of the second external electrode 2 is electrically conductively connected to the second internal electrodes of the first and second actuator sections 81, 82. The second electrode segment 42 of the first external electrode 4 is electrically conductively connected to the first internal electrodes 5 in the first and second actuator sections 82, 83 electrically conductively.

FIG. 8 shows the temporal profile of the control signals or reference-ground potentials relative to a reference potential, U1, U2, U3, U4, U5, U6, which are provided by the control arrangement 6 in FIG. 7. The first control voltage U1 is present at the terminal 410 of the first electrode segment 41 of the first external electrode 4. The third control voltage U3 is present at the terminal 420 of the second electrode segment 42 of the first external electrode 4. The fifth control voltage U5 is present at the terminal 430 of the third electrode segment 43 of the first external electrode 4. The second control voltage U2 is present at the terminal 210 of the first electrode segment 21 of the second external electrode 2. The fourth control voltage U4 is present at the terminal 220 of the second electrode segment 22 of the second external electrode 2. The sixth control voltage U6 is present at the terminal 230 of the third electrode segment 23 of the second external electrode 2. The signs of the first, third, fifth control voltages U1, U3, U5 are opposite to the signs of the second, fourth and sixth control voltages U2, U4, U6.

As a result of the sixth control voltage U6 rising, firstly the fifth actuator section 85 is controlled. With the rising of the fifth control voltage U5, present at the third electrode segment 43 of the first external electrode 4, the voltage between the first and second internal electrodes 5, 3 of the fifth actuator section 85 is increased, since the potential difference increases, and also the fourth actuator section 84 begins to be controlled. With the rising of the fourth control voltage U4, present at the second electrode segment 22 of the second external electrode 2, the voltage between the first and second internal electrodes 5, 3 of the fourth actuator section 84 is increased, since the potential difference increases, and also the third actuator section 83 begins to be controlled. This control is continued progressively for the other actuator sections.

The actuator sections 82, 83, 84 that are not on the edge side are controlled in each case in two steps on account of the overlapping arrangement of the segments 21, 22, 23, 41, 42, 43 of the external electrodes 4, 2.

It should be noted that the temporal sequence of the voltage rises and falls at the terminals 210, 220, 230, 410, 420 430 for expansion and compression is the same, but the voltage rises and falls at individual terminals 210, 220, 230, 410, 420 430 differ with regard to their sign during expansion and compression.

It should be noted that the features of the embodiments can be combined.

REFERENCE SIGNS

1 Actuator
4, 2 External electrode
5, 3 Internal electrode
6 Control arrangement
7 Reference-ground potential
16 Piezoelement
21, 22, 23, 41, 42, 43 Electrode segment
81, 82, 83, 84, 85 Actuator section
210, 220, 230, 410, 420 430 Terminal

The invention claimed is:

1. An actuator system comprising a control arrangement and an actuator, wherein the actuator, which is expandable in a predefined direction, comprises:
    piezoelements arranged in a stacked fashion;
    first and second internal electrodes arranged alternately between the piezoelements;
    a first external electrode, which is electrically conductively connected to the first internal electrodes;
    a second external electrode, which is electrically conductively connected to the second internal electrodes; and
    a plurality of actuator sections comprising a first actuator section, which is arranged in the predefined direction relative to a second actuator section,
    wherein the second external electrode comprises separate electrode segments, which are electrically conductively connected in each case to the second internal electrodes in one of the actuator sections or in a group of the actuator sections,
    wherein the control arrangement is configured to apply a first control signal can be applied to the first actuator section or a first group of actuator sections using a time delay, and to apply a second control signal in a time-shifted manner to the second actuator section or a second group of actuator sections, in such a way that the control arrangement, based on the time delay, applies the first control signal to the first actuator section or the first group of actuator sections after applying the second control signal to the second actuator section or the second group of actuator sections, and
    wherein the time-shift depends on the velocity of sound in the actuator, so that elastic partial waves generated by control signals during the expansion of the actuator in the respective actuator sections or groups of actuator sections are superimposed.

2. The actuator according to claim 1, wherein the first external electrode comprises separate electrode segments which are electrically conductively connected in each case to the first internal electrodes in one of the actuator sections or in a group of the actuator sections.

3. The actuator according to claim 1 or 2, wherein the electrode segments are electrically conductively connected in each case to either the first or the second internal electrodes in adjacent actuator sections.

4. The actuator according to claim 1, wherein the first external electrode comprises a first electrode segment, and the first electrode segment is electrically conductively connected to the first internal electrodes in the first actuator section and in the second actuator section adjacent thereto, and wherein the second external electrode comprises a second electrode segment, and the second electrode segment is electrically conductively connected to the second internal electrodes in the second actuator section and in a third actuator section adjacent thereto.

5. The actuator according to claim 1, wherein at least the electrode segments of the second external electrode in each case comprise a terminal, to which a control signal can be applied.

6. The actuator system according to claim 1, wherein the control arrangement is suitable for applying voltages having different signs relative to a reference-ground potential to the electrode segments connected to the first internal electrodes and the electrode segments connected to second internal electrodes.

7. A control of an actuator comprising:
piezoelements arranged in a stacked fashion, first and second internal electrodes arranged alternately between the piezoelements;
the actuator comprises a plurality of actuator sections, wherein the actuator is expandable in one direction; and
a control arrangement configured to apply a first voltage between the first and second internal electrodes in a first actuator section or in a first group of actuator sections using a time delay, and to apply a second control voltage between the first and second internal electrodes in a second actuator section or in a second group of actuator sections in a time-shifted manner, in such a way that the control arrangement applies, based on the time delay, the first voltage between the first and second internal electrodes in a first actuator section or in a first group of actuator sections after applying the second control voltage between the first and second internal electrodes in a second actuator section or in a second group of actuator sections,
wherein the first actuator section is arranged in the one direction relative to the second actuator section, and
wherein the time-shift is chosen in a manner dependent on the velocity of sound in the actuator, so that elastic partial waves generated by control signals during the expansion of the actuator in the respective actuator sections or groups of actuator sections are superimposed.

\* \* \* \* \*